United States Patent
Lee

(10) Patent No.: US 8,259,519 B2
(45) Date of Patent: Sep. 4, 2012

(54) SYNCHRONOUS SEMICONDUCTOR MEMORY DEVICE

(75) Inventor: Kang-Youl Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 120 days.

(21) Appl. No.: 12/914,541

(22) Filed: Oct. 28, 2010

(65) Prior Publication Data

US 2012/0051159 A1    Mar. 1, 2012

(30) Foreign Application Priority Data

Aug. 27, 2010  (KR) .................. 10-2010-0083471

(51) Int. Cl.
*G11C 7/00* (2006.01)
(52) U.S. Cl. ............ 365/193; 365/189.05; 365/191; 365/233.1
(58) Field of Classification Search .......... 365/193, 365/191, 233.1, 233.14, 189.05, 189.11
See application file for complete search history.

(56) References Cited

U.S. PATENT DOCUMENTS

| 6,456,544 B1 * | 9/2002 | Zumkehr | 365/193 |
| 6,906,970 B2 * | 6/2005 | Kim et al. | 365/201 |
| 7,773,709 B2 * | 8/2010 | Lee | 375/355 |

FOREIGN PATENT DOCUMENTS

KR    100929845    12/2009

OTHER PUBLICATIONS

Office Action issued by the Korean Intellectual Property Office on Jan. 16, 2012.

* cited by examiner

*Primary Examiner* — Son Dinh
(74) *Attorney, Agent, or Firm* — IP & T Group LLP

(57) ABSTRACT

A synchronous semiconductor memory device includes a data alignment reference pulse generation unit configured to generate a data alignment reference pulse in response to a data strobe signal, a data alignment suspension signal generation unit configured to generate a data alignment suspension signal in response to the data alignment reference pulse, a data strobe termination signal, and a write pulse, and a data alignment unit configured to align input data in response to the data alignment reference pulse and stop aligning the input data in response to the data alignment suspension signal.

12 Claims, 6 Drawing Sheets

SYNCHRONOUS SEMICONDUCTOR MEMORY DEVICE

CROSS-REFERENCE TO RELATED APPLICATION

The present application claims priority of Korean Patent Application No. 10-2010-0083471, filed on Aug. 27, 2010, which is incorporated herein by reference in its entirety.

BACKGROUND OF THE INVENTION

Exemplary embodiments of the present invention relate to a semiconductor designing technology, and more particularly, to a write path of a synchronous semiconductor memory device.

A semiconductor memory device such as Dynamic Random Access Memory (DRAM) receives a write data from a chipset, e.g., a memory controller, and outputs a read data to the chipset. In case of a synchronous semiconductor memory device, both chipset and memory are synchronized with a system clock to be operated. However, when a data is transferred from a chipset to a semiconductor memory device, the load and trace/track of the data signal are different from those of the system clock and skew may occur between the data and the system clock.

To reduce the skew between the data and the system clock, a data strobe signal DQS is transferred along with the data when the data is transferred from the chipset to the semiconductor memory device. The data strobe signal DQS is called an echo clock and it may have the same load and trace of the data signal. Therefore, when the semiconductor memory device processes the data based on the data strobe signal DQS, skew occurring in plural memories due to the difference in their positions from a circuit transmitting the system clock may also be minimized. Meanwhile, during a read operation, the semiconductor memory device transfers a read DQS to the chipset along with the read data.

FIG. 1 a circuit diagram illustrating a write path of a conventional synchronous semiconductor memory device.

Referring to FIG. 1, the write path of the conventional synchronous semiconductor memory device includes a DQS input buffering unit 110, a data strobe falling pulse (DSFP) generation unit 120, a DQS buffer disable signal generation unit 130, a data alignment unit 140, a GIO write driving unit 150. The DQS input buffering unit 110 buffers a data strobe signal DQS in response to a DQS buffer disable signal DISABLE_DQS. The DSFP generation unit 120 receives an output signal of the DQS input buffering unit 110 and generates a data strobe falling pulse DSFP which corresponds to a falling edge of the data strobe signal DQS. The DQS buffer disable signal generation unit 130 generates the DQS buffer disable signal DISABLE_DQS in response to the data strobe falling pulse DSFP, a data strobe termination signal DIS_DSP, and a write pulse WRITE_STATE. The data alignment unit 140 aligns input data Din transferred from a data input buffer (not shown) in response to the data strobe falling pulse DSFP. The GIO write driving unit 150 synchronizes aligned data ALGN_R0, ALGN_R1, ALGN_F0, and ALGN_F1, which are outputted from the data alignment unit 140, with a data input clock DINCLK and transfers synchronized data to global data buses GIO_Q0, GIO_Q1, GIO_Q2 and GIO_Q3.

Herein, the data strobe termination signal DIS_DSP is a signal which pulses to a logic high level after a time corresponding to a burst length (BL) passes from a moment when a write command is applied. The write pulse WRITE_STATE is a signal which pulses to a logic low level when a write command is applied. The write pulse WRITE_STATE is enabled to a logic low level before an internal write signal INT_WT (refer to FIG. 2) is enabled. Also, the data input clock DINCLK is a signal which pulses to a logic high level after a certain time in consideration of a write latency WL from a moment when a write command is applied.

Meanwhile, the DQS buffer disable signal generation unit 130 includes an AND gate AND1, a pull-up PMOS transistor MP1, a pull-down NMOS transistor MN1, and a latch INV1 and INV2.

The AND gate AND1 receives the data strobe falling pulse DSFP and the data strobe termination signal DIS_DSP as its input. The pull-up PMOS transistor MP1 includes a source coupled with a power source voltage VDD terminal and a drain coupled with an output terminal N1 of the DQS buffer disable signal generation unit 130, and receives the write pulse WRITE_STATE as a gate input. The pull-down NMOS transistor MN1 includes a source coupled with a ground voltage VSS terminal and a drain coupled with the output terminal N1 of the DQS buffer disable signal generation unit 130, and receives an output signal of the AND gate AND1 as a gate input. The latch INV1 and INV2 latches a signal on the output terminal N1 of the DQS buffer disable signal generation unit 130.

The data alignment unit 140 includes an inverter INV3, a first D-flipflop 142, a second D-flipflop 144, a third D-flipflop 146, and a fourth D-flipflop 148. The inverter INV3 receives the data strobe falling pulse DSFP as its input. The first D-flipflop 142 transfers the input data Din in response to a falling edge of the output signal of the inverter INV3. The second D-flipflop 144 transfers the aligned data ALGN_R1 outputted from the first D-flipflop 142 in response to the falling edge of the output signal of the inverter INV3. The third D-flipflop 146 transfers the input data Din in response to the falling edge of the output signal of the inverter INV3. The fourth D-flipflop 148 transfers the aligned data ALGN_F1 outputted from the third D-flip-flop 146 in response to the falling edge of the output signal of the inverter INV3.

Also, the GIO write driving unit 150 includes a first GIO write driver 152, a second GIO write driver 154, a third GIO write driver 156, and a fourth GIO write driver 158. The first GIO write driver 152 synchronizes the aligned data ALGN_R0 outputted from the second D-flipflop 144 with the data input clock DINCLK and transfers the synchronized data to a first global data line GIO_Q0. The second GIO write driver 154 synchronizes the aligned data ALGN_R1 outputted from the first D-flipflop 142 with the data input clock DINCLK and transfers the synchronized data to a second global data line GIO_Q1. The third GIO write driver 156 synchronizes the aligned data ALGN_F0 outputted from the fourth D-flipflop 148 with the data input clock DINCLK and transfers the synchronized data to a third global data line GIO_Q2. The fourth GIO write driver 158 synchronizes the aligned data ALGN_F1 outputted from the third D-flipflop 146 with the data input clock DINCLK and transfers the synchronized data to a fourth global data line GIO_Q3.

FIG. 2 is a timing diagram of the circuit shown in FIG. 1.

Referring to FIG. 2, first, when a write command is applied, the semiconductor memory device receives a data DQ along with a data strobe signal DQS. FIG. 2 shows a case where write commands are consecutively applied (BL=4). A signal 'INT_WT' denotes an internal write signal generated upon receipt of a write command.

Meanwhile, the DSFP generation unit 120 generates the data strobe falling pulse DSFP which is enabled to a logic high level at every falling edge of the data strobe signal DQS, and the data alignment unit 140 outputs the aligned data ALGN_R0, ALGN_R1, ALGN_F0, and ALGN_F1 at a rising edge of the data strobe falling pulse DSFP.

When both of the data strobe falling pulse DSFP and the data strobe termination signal DIS_DSP become logic high levels at the end of the data input, the DQS buffer disable signal generation unit 130 makes the DQS buffer disable signal DISABLEDQS transition to a logic low level. As a result, the DQS input buffering unit 110 is disabled and stop receiving the data strobe signal DQS.

Meanwhile, the aligned data ALGN_R0, ALGN_R1, ALGN_F0, and ALGN_F1 are synchronized with the data input clock DINCLK and transferred by the first to fourth GIO write drivers 152, 154, 156 and 158 to the first to fourth global data lines GIO_Q0, GIO_Q1, GIO_Q2 and GIO_Q3.

However, a one-time ringing may occur frequently when the data strobe signal DQS toggles and goes back to a high impedance (Hi-Z) state after its last falling edge. This phenomenon is referred to as a write postamble ringing. To be specific, the phenomenon means that after the data strobe signal DQS finishes its toggling, it does not go back to the high impedance (Hi-Z) state but transitions due to noise.

FIG. 3 is a timing diagram of the circuit shown in FIG. 1 when the write postamble ringing phenomenon occurs.

Referring to FIG. 3, it may be seen that the ringing occurs when the toggling data strobe signal DQS goes back to the high impedance (Hi-Z) state after its last falling edge.

If the write postamble ringing phenomenon occurs before the DQS buffer disable signal DISABLE_DQS transitions to a logic low level, the DSFP generation unit 120 recognizes it as a falling edge of the data strobe signal DQS and a small glitch may occur in the data strobe falling pulse DSFP.

The values of the aligned data ALGN_R0, ALGN_R1, ALGN_F0, and ALGN_F1 are changed early due to the glitch, and accordingly an erroneous data is synchronized with a rising edge of the data input clock DINCLK and an undesired data may be loaded on the first to fourth global data lines GIO_Q0, GIO_Q1, GIO_Q2 and GIO_Q3, which is a failure.

In other words, in a structure where the DQS input buffering unit 110 is controlled as the DQS buffer disable signal DISABLE_DQS is fed back, a moment when the DQS buffer disable signal DISABLE_DQS is enabled becomes a moment when the DQS input buffering unit 110 is disabled after all. Therefore, there are concerns in the timing that the glitch occurring in the data strobe falling pulse DSFP may be used before the DQS input buffering unit 110 is disabled. Due to such timing, the values of the aligned data ALGN_R0, ALGN_R1, ALGN_F0, and ALGN_F1 are changed early and undesired data may be loaded on the first to fourth global data lines GIO_Q0, GIO_Q1, GIO_Q2 and GIO_Q3, which is problematic.

The above-described problem may occur not only in the case where write commands are consecutively applied but also in a case where a write command is applied alone.

SUMMARY OF THE INVENTION

An embodiment of the present invention is directed to a synchronous semiconductor memory device capable of preventing/reducing occurrence of a data error caused by a write postamble ringing phenomenon of a data strobe signal DQS.

In accordance with an exemplary embodiment of the present invention, a synchronous semiconductor memory device includes a data alignment reference pulse generation unit configured to generate a data alignment reference pulse in response to a data strobe signal, a data alignment suspension signal generation unit configured to generate a data alignment suspension signal in response to the data alignment reference pulse, a data strobe termination signal, and a write pulse, and a data alignment unit configured to align input data in response to the data alignment reference pulse and stop aligning the input data in response to the data alignment suspension signal.

In accordance with another exemplary embodiment of the present invention, a synchronous semiconductor memory device includes a data strobe signal input buffering unit configured to buffer a data strobe signal, a data strobe falling pulse generation unit configured to generate a data strobe falling pulse corresponding to a falling edge of the data strobe signal in response to an output signal of the data strobe signal input buffering unit, a data strobe falling pulse masking signal generation unit configured to generate a data strobe falling pulse masking signal in response to the data strobe falling pulse, a data strobe termination signal, and a write pulse, and a data alignment unit configured to align input data in response to the data strobe falling pulse and stop aligning the input data in response to the data strobe falling pulse masking signal.

In accordance with further exemplary embodiment of the present invention, a method of operating a synchronous semiconductor memory device includes generating a data alignment reference pulse in response to a data strobe signal, generating a data alignment suspension signal in response to the data alignment reference pulse, a data strobe termination signal, and a write pulse, aligning input data in response to the data alignment reference pulse, and controlling a cut-off of aligning the input data in response to the data alignment suspension signal.

DESCRIPTION OF SPECIFIC EMBODIMENTS

Figure 1:
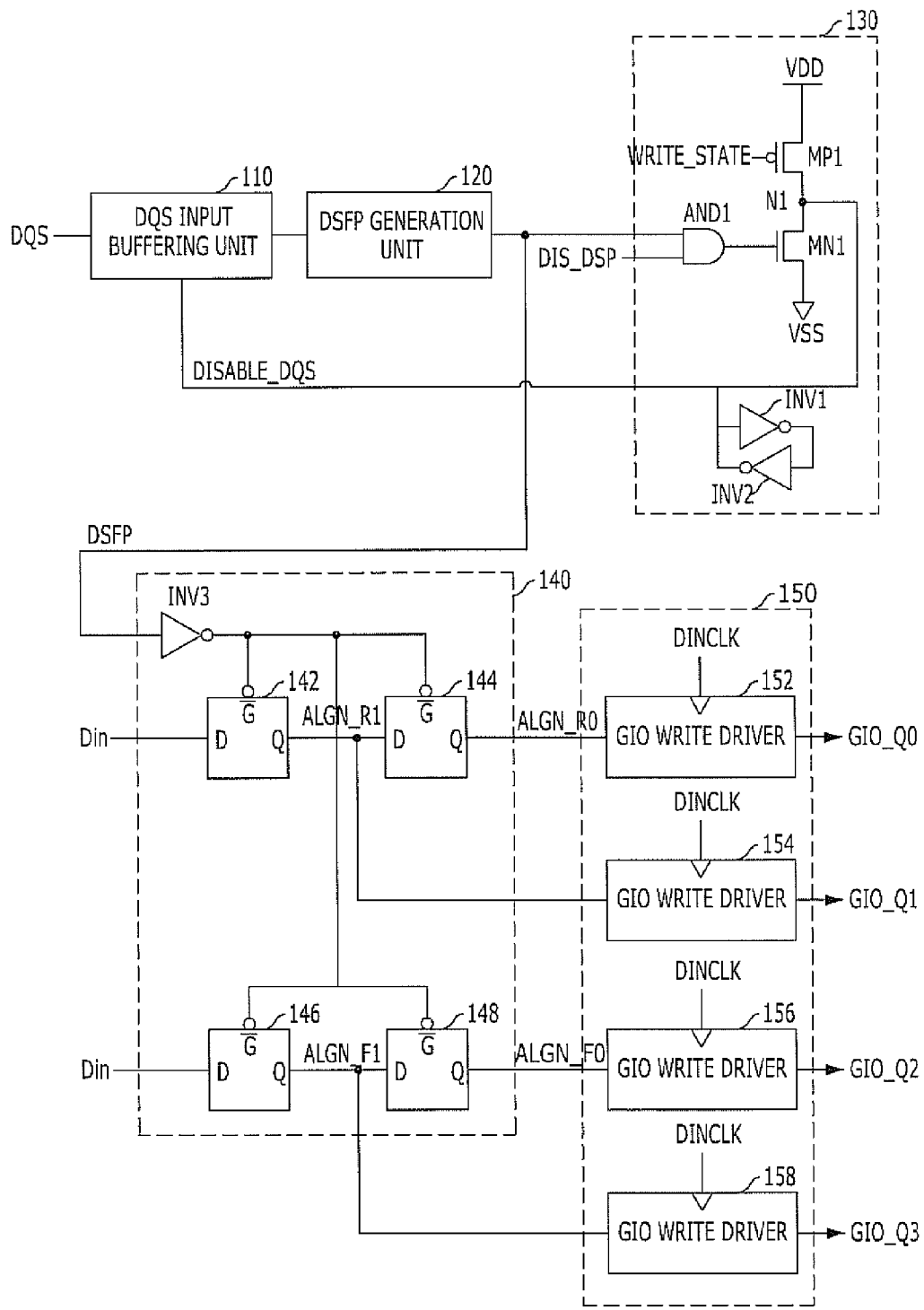
FIG. 1 a circuit diagram illustrating a write path of a conventional synchronous semiconductor memory device.
Figure 2:
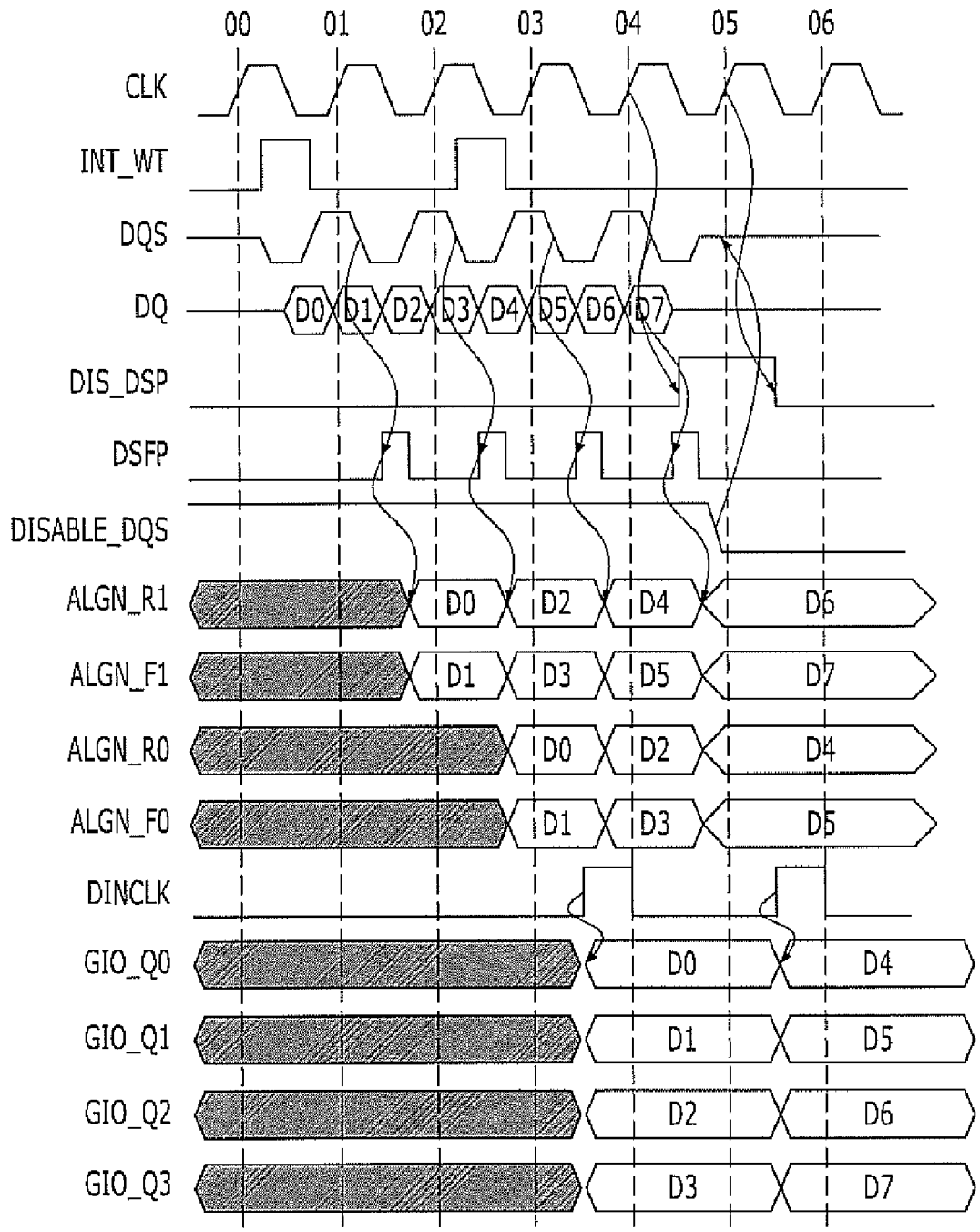
FIG. 2 is a timing diagram of a circuit shown in FIG. 1.
Figure 3:
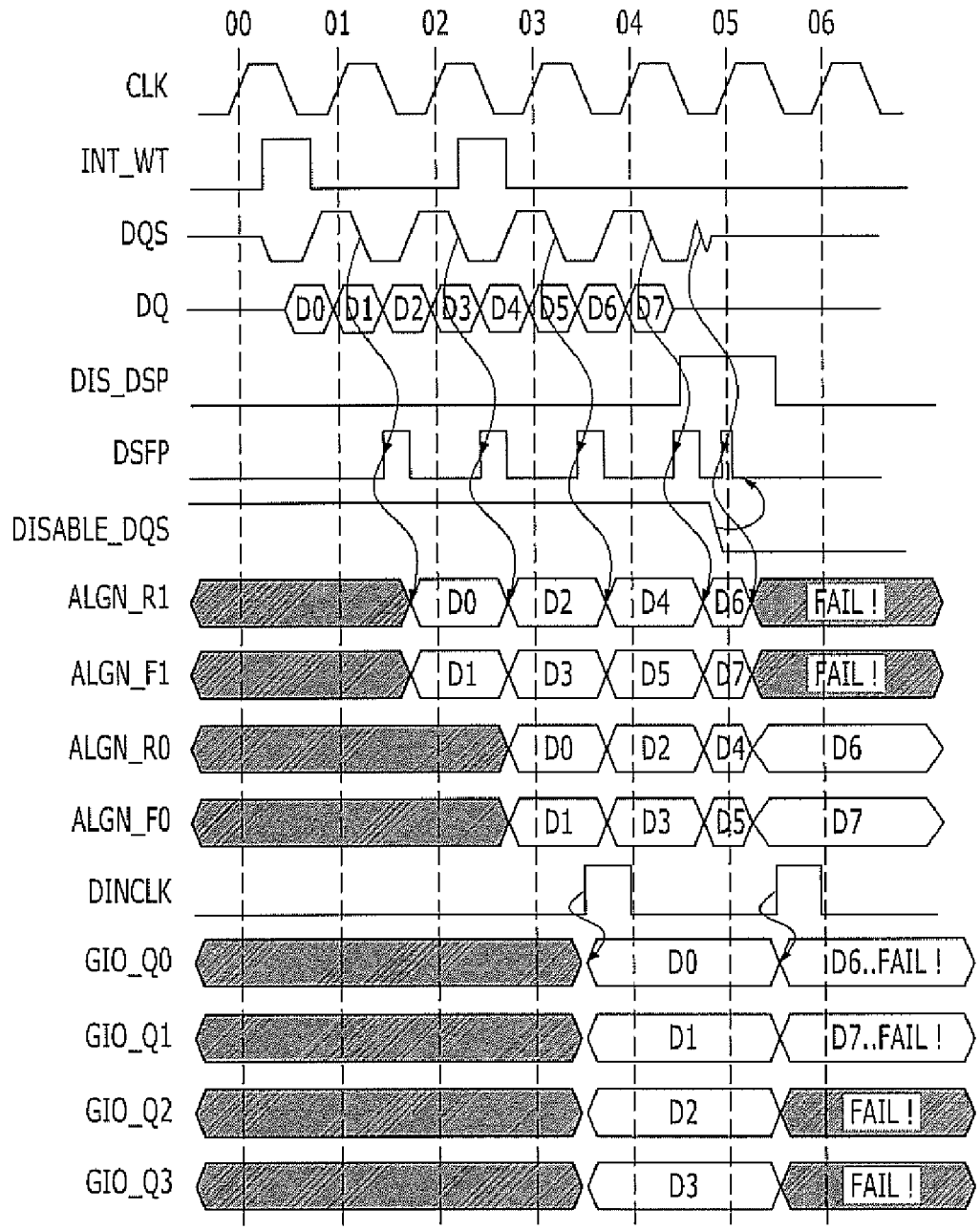
FIG. 3 is a timing diagram of the circuit shown in FIG. 1 when a write postamble ringing phenomenon occurs.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
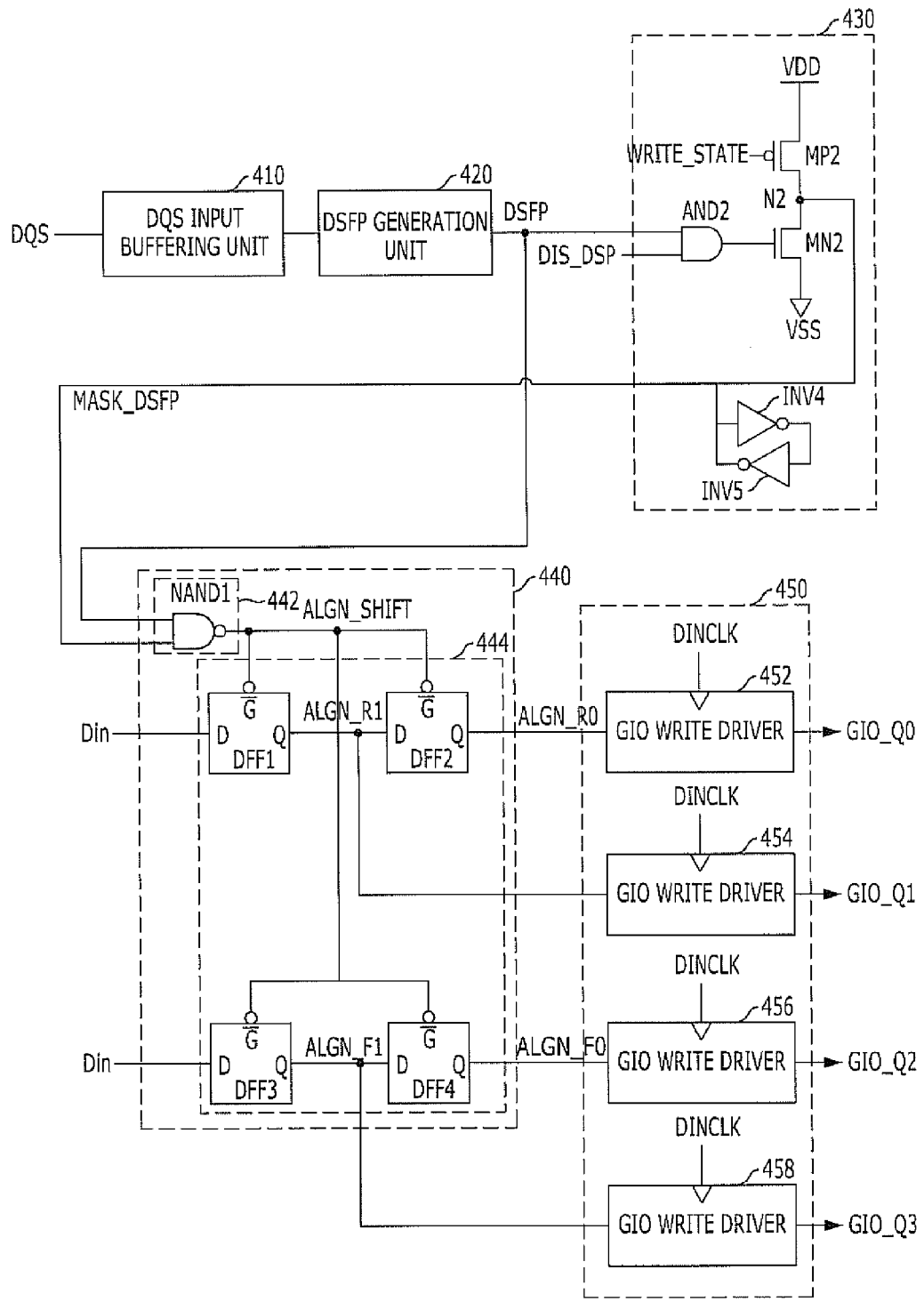
FIG. 4 is a circuit diagram illustrating a write path of a synchronous semiconductor memory device in accordance with an embodiment of the present invention.

FIG. 4 is a circuit diagram illustrating a write path of a synchronous semiconductor memory device in accordance with an embodiment of the present invention.

Referring to FIG. 4, the write path of a synchronous semiconductor memory device includes a DQS input buffering unit 410, a DSFP generation unit 420, a DSFP masking signal generation unit 430, a data alignment unit 440, and a GIO write driving unit 450. The DQS input buffering unit 410 buffers a data strobe signal DQS. The DSFP generation unit 420 receives an output signal of the DQS input buffering unit 410 and generates a data strobe falling pulse DSFP corresponding to a falling edge of the data strobe signal DQS. The DSFP masking signal generation unit 430 generates a data strobe falling pulse masking signal MASK_DSFP in response to the data strobe falling pulse DSFP, a data strobe termination signal DIS_DSP, and a write pulse WRITE_STATE. The data alignment unit 440 aligns input data Din in response to the data strobe falling pulse DSFP and stops aligning the input data Din in response to the data strobe falling pulse masking signal MASK_DSFP. The GIO write driving unit 450 synchronizes aligned data ALGN_R0, ALGN_R1, ALGN_F0, and ALGN_F1 outputted from the data alignment unit 440 with a data input clock DINCLK and transfers the synchronized data to first to fourth global data lines GIO_Q0, GIO_Q1, GIO_Q2 and GIO_Q3.

Herein, the data strobe termination signal DIS_DSP is a signal which pulses to a logic high level after a time corresponding to a burst length (BL) passes from a moment when a write command is applied. The write pulse WRITE_STATE is a signal which pulses to a logic low level when a write command is applied. The write pulse WRITE_STATE transitions to a logic low level before an internal write signal INT_WT (refer to FIG. 5) is enabled. Also, the data input clock DINCLK is a signal which pulses to a logic high level after a certain time in consideration of a write latency WL from a moment when a write command is applied.

Meanwhile, the DSFP masking signal generation unit 430 includes an AND gate AND2, a pull-up PMOS transistor MP2, a pull-down NMOS transistor MN2, and a latch INV4 and INV5.

The AND gate AND2 receives the data strobe falling pulse DSFP and the data strobe termination signal DIS_DSP as its input. The pull-up PMOS transistor MP2 includes a source coupled with a power source voltage VDD terminal and a drain coupled with an output terminal N2 of the DSFP masking signal generation unit 430, and receives the write pulse WRITE_STATE as a gate input. The pull-down NMOS transistor MN2 includes a source coupled with a ground voltage VSS terminal and a drain coupled with the output terminal N2 of the DSFP masking signal generation unit 430, and receives an output signal of the AND gate AND2 as a gate input. The latch INV4 and INV5 latches a signal on the output terminal N2 of the DSFP masking signal generation unit 430.

The data alignment unit 440 includes a DSFP cut-off block 442 and a data transfer block 444. The DSFP cut-off block 442 selectively cuts off the transfer of the data strobe falling pulse DSFP based on the data strobe falling pulse masking signal MASK_DSFP. The data transfer block 444 transfers the input data Din in response to an output signal ALGN_SHIFT of the DSFP cut-off block 442. Herein, the DSFP cut-off block 442 may be realized as a NAND gate NAND1 which receives the data strobe falling pulse DSFP and the data strobe falling pulse masking signal MASK_DSFP, and the transfer of the data strobe falling pulse DSFP is controlled to be cut off as the data strobe falling pulse masking signal MASK_DSFP is enabled. The data transfer block 444 includes a first D-flipflop DFF1, a second D-flipflop DFF2, a third D-flipflop DFF3, and a fourth D-flipflop DFF4. The first D-flip-flop DFF1 transfers the input data Din in response to a falling edge of the output signal ALGN_SHIFT of the DSFP cut-off block 442. The second D-flipflop DFF2 transfers the aligned data ALGN_R1 outputted from the first D-flipflop DFF1 in response to the falling edge of the output signal ALGN_SHIFT of the DSFP cut-off block 442. The third D-flipflop DFF3 transfers the input data Din in response to the falling edge of the output signal ALGN_SHIFT of the DSFP cut-off block 442. The fourth D-flipflop DFF4 transfers the aligned data ALGN_F1 outputted from the third D-flipflop DFF3 in response to the falling edge of the output signal ALGN_SHIFT of the DSFP cut-off block 442.

Also, the GIO write driving unit 450 includes a first GIO write driver 452, a second GIO write driver 454, a third GIO write driver 456, and a fourth GIO write driver 458. The first GIO write driver 452 synchronizes the aligned data ALGN_R0 outputted from the second D-flipflop DFF2 with the data input clock DINCLK and transfers the synchronized data to the first global data line GIO_Q0. The second GIO write driver 454 synchronizes the aligned data ALGN_R1 outputted from the first D-flipflop DFF1 with the data input clock DINCLK and transfers the synchronized data to the second global data line GIO_Q1. The third GIO write driver 456 synchronizes the aligned data ALGN_F0 outputted from the fourth D-flipflop DFF4 with the data input clock DINCLK and transfers the synchronized data to the third global data line GIO_Q2. The fourth GIO write driver 458 synchronizes the aligned data ALGN_F1 outputted from the third D-flipflop DFF3 with the data input clock DINCLK and transfers the synchronized data to the fourth global data line GIO_Q3.

Hereafter, an operation of the synchronous semiconductor memory device according to the embodiment of the present invention is described with reference to FIG. 5.

Figure 5:
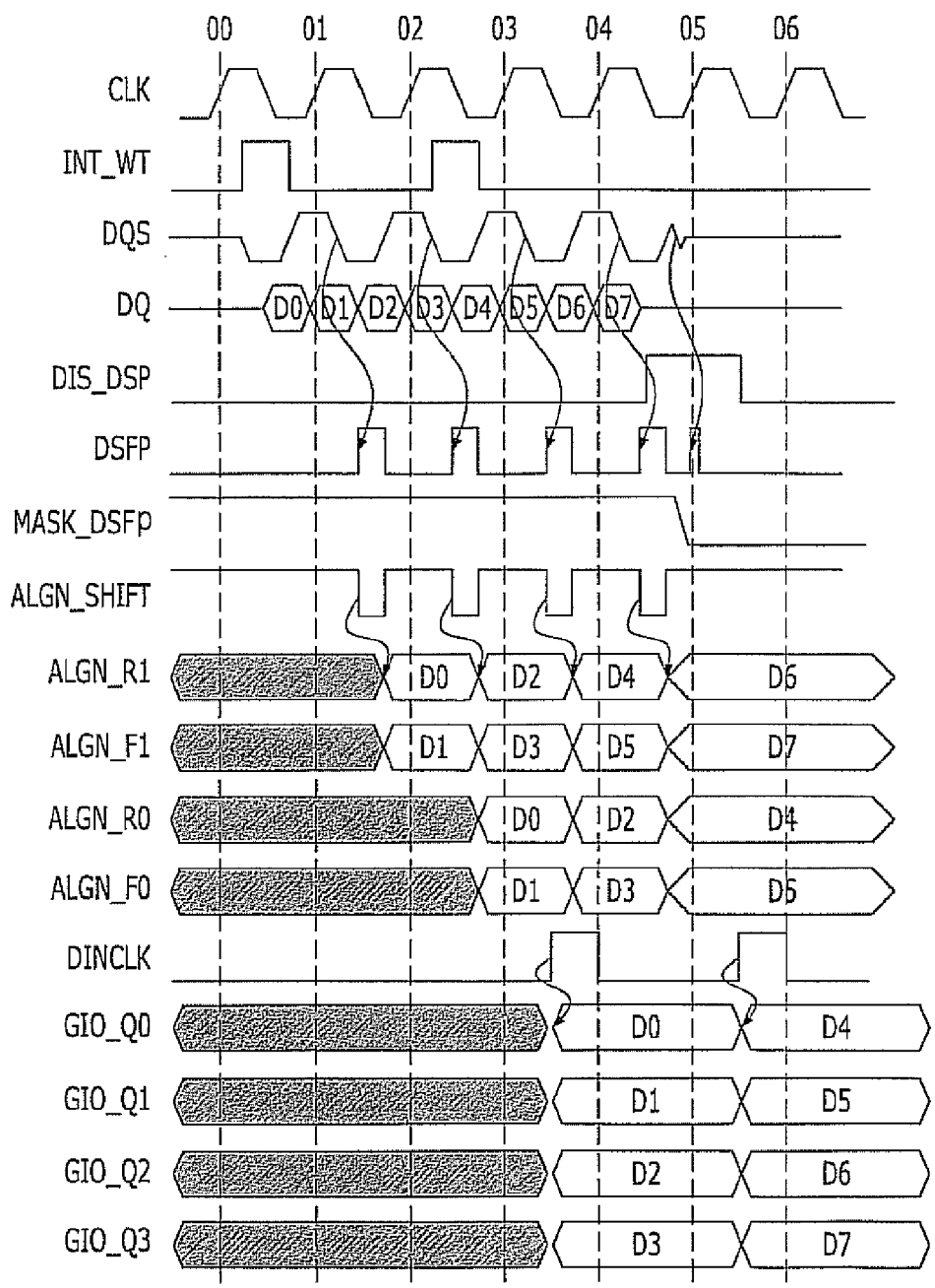
FIG. 5 is a timing diagram of a circuit shown in FIG. 4.

FIG. 5 is a timing diagram of the circuit shown in FIG. 4.

Referring to FIG. 5, first, when a write command is applied, the semiconductor memory device receives a data DQ along with a data strobe signal DQS. FIG. 5 shows a case where write commands are consecutively applied (BL=4). A signal 'INT_WT' denotes an internal write signal generated upon receipt of a write command.

Meanwhile, the DSFP generation unit 420 generates the data strobe falling pulse DSFP which is enabled to a logic high level at every falling edge of the data strobe signal DQS, and the DSFP masking signal generation unit 430 outputs the data strobe falling pulse masking signal MASK_DSFP of a logic high level in response to the data strobe falling pulse DSFP, the data strobe termination signal DIS_DSP, and the write pulse WRITE_STATE. To describe the process of generating the data strobe falling pulse masking signal MASK_DSFP in detail herein, the AND gate AND2 unconditionally outputs an output signal of a logic low level regardless of the logic level of the data strobe falling pulse DSFP, which is inputted to one input terminal, because the AND gate AND2 receives the data strobe termination signal DIS_DSP of a logic low level through the other input terminal. Thus, the pull-down NMOS transistor MN2 is turned off. On the contrary, the pull-up PMOS transistor MP2 is turned on by the write pulse WRITE_STATE which is enabled to a logic low level before the internal write signal INT_WT is enabled. Therefore, the DSFP masking signal generation unit 430 outputs the data strobe falling pulse masking signal MASK_DSFP of a logic high level. Herein, the logic level state of the data strobe falling pulse masking signal MASK_DSFP is latched by the latch INV4 and INV5 coupled with the output terminal N2.

Accordingly, the data alignment unit 440 outputs the aligned data ALGN_R0, ALGN_R1, ALGN_F0, and ALGN_F1 to the GIO write driving unit 450 in response to the data strobe falling pulse DSFP. To be specific, since the DSFP cut-off block 442, which is realized as the NAND gate NAND1, receives the data strobe falling pulse masking signal MASK_DSFP of a logic high level through one input terminal, it inverts the data strobe falling pulse DSFP, which is inputted through the other input terminal, and outputs inverted data strobe falling pulse. As a result, the data transfer block 444, which is the first to fourth D-flipflop DFF1, DFF2, DFF3 and DFF4, outputs the aligned data ALGN_R0, ALGN_R1, ALGN_F0, and ALGN_F1 to the first to fourth GIO write drivers 452, 454, 456 and 458, respectively, according to a falling edge of the output signal ALGN_SHIFT of the DSFP cut-off block 442.

Then, the first to fourth GIO write drivers 452, 454, 456 and 458 respectively synchronizes the inputted aligned data ALGN_R0, ALGN_R1, ALGN_F0, and ALGN_F1 with the data input clock DINCLK and transfers them to the first to fourth global data lines GIO_Q0, GIO_Q1, GIO_Q2 and GIO_Q3.

In this state, if the input of the data DQ is completed and both of the data strobe falling pulse DSFP and the data strobe termination signal DIS_DSP become logic high levels, the DSFP masking signal generation unit 430 makes the data strobe falling pulse masking signal MASK_DSFP transition to a logic low level. As a result, the DSFP cut-off block 442 cuts off the transfer of the data strobe falling pulse DSFP. In other words, the DSFP cut-off block 442 outputs the output signal ALGN_SHIFT of a logic high level regardless of the data strobe falling pulse DSFP in a duration where the data strobe falling pulse masking signal MASK_DSFP is in a logic low level. In the duration, the first to fourth D-flipflop DFF1, DFF2, DFF3 and DFF4 are disabled and the data alignment operation is not performed any longer.

In the above described operation, even if glitch occurs in the data strobe falling pulse DSFP by a write postamble ringing phenomenon, the data strobe falling pulse masking signal MASK_DSFP can transition to a logic low level in the duration where the glitch occurs. Therefore, abnormal data alignment caused by the glitch may be prevented. In short, a data error caused by the write postamble ringing phenomenon may be prevented.

Figure 6:
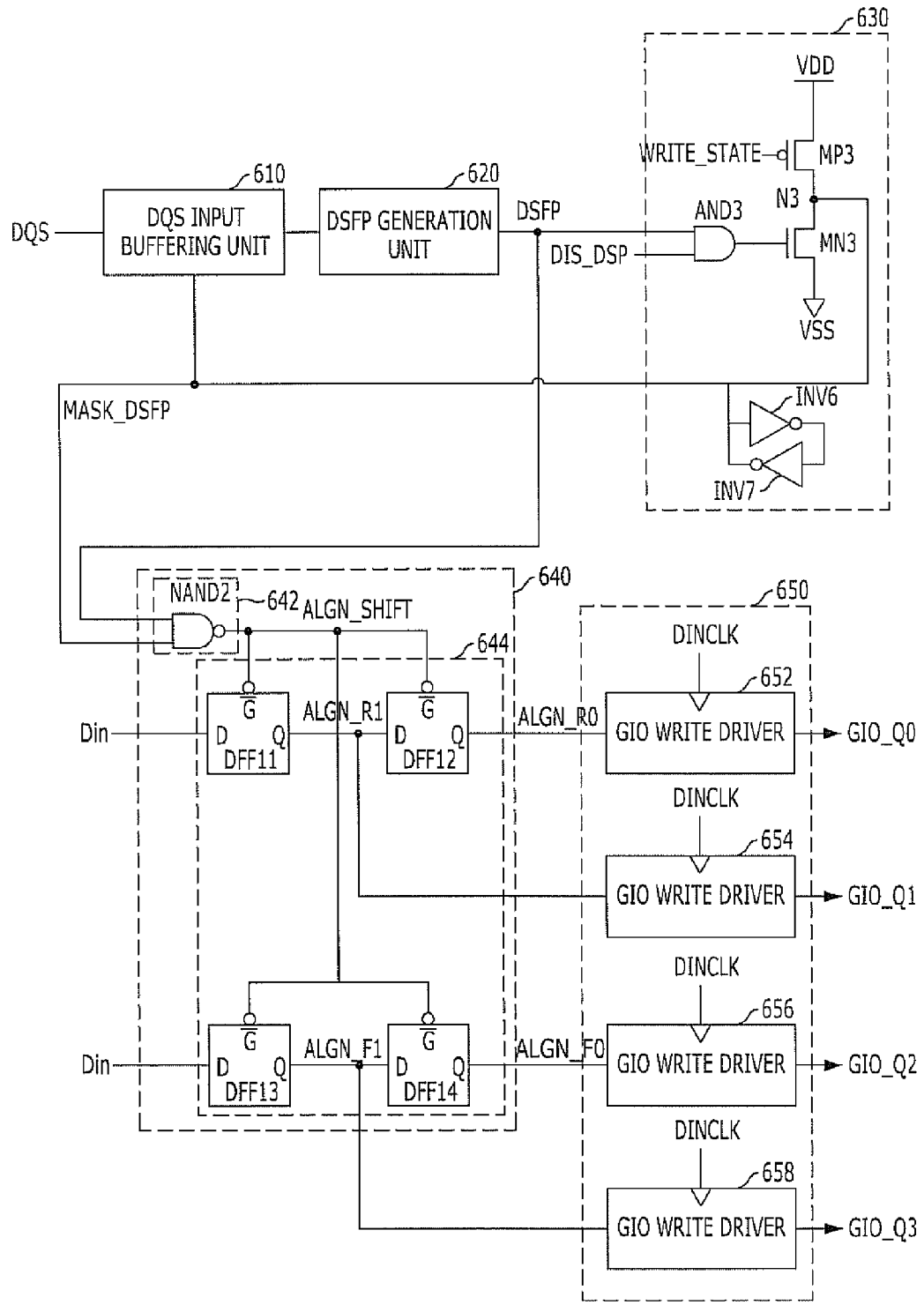
FIG. 6 is a circuit diagram illustrating a write path of a synchronous semiconductor memory device in accordance with another embodiment of the present invention.

Meanwhile, although the write postamble ringing phenomenon is prevented primarily in the above described circuit diagram illustrating a write path of the synchronous semiconductor memory device according to the embodiment of the present invention, the data error caused by the write postamble ringing phenomenon may be prevented from occurring even more strongly by providing a double prevention in accordance with another embodiment of the present invention, which is illustrated in FIG. 6.

FIG. 6 is a circuit diagram illustrating a write path of a synchronous semiconductor memory device in accordance with another embodiment of the present invention.

Referring to FIG. 6, a DQS input buffering unit 610 is determined to be enabled in response to a data strobe falling pulse masking signal MASK_DSFP. In other words, the DQS input buffering unit 610 is disabled when the data strobe falling pulse masking signal MASK_DSFP transitions to a logic low level so as not to receive a data strobe signal DQS any longer. Therefore, in accordance with another embodiment of the present invention, a DSFP cut-off block 642 performs a primary protection against the write postamble ringing phenomenon, and a secondary protection against the write postamble ringing phenomenon is made as the DQS input buffering unit 610 is disabled. As a result, the capability of preventing a data error is remarkably improved.

Since a DSFP generation unit 620, a DSFP masking signal generation unit 630, a data alignment unit 640, and a GIO write driving unit 650 which are illustrated in FIG. 6 correspond to the DSFP generation unit 420, the DSFP masking signal generation unit 430, the data alignment unit 440, and the GIO write driving unit 450, further description on them is omitted herein.

Also, since the operation of the circuit illustrated in FIG. 6 is the same as the operation of the circuit illustrated in FIG. 5, except that the DQS input buffering unit 610 is disabled, the description on the operation is omitted herein as well.

In a semiconductor device according to the exemplary embodiment of the present invention, a failure of a write operation may be prevented by cutting off an abnormal transfer operation of aligned data, which occurs due to a write postamble ringing phenomenon of a data strobe signal DQS.

While the present invention has been described with respect to the specific embodiments, it will be apparent to those skilled in the art that various changes and modifications may be made without departing from the spirit and scope of the invention as defined in the following claims.

For example, although a case where 8 data are inputted by consecutive write commands without a gap is described in the above described embodiment (BL=4), the technology of the present invention may be applied to all cases that a ringing phenomenon occurs in a postamble of a data strobe signal DQS including a case where a write command is applied alone.

What is claimed is:

1. A synchronous semiconductor memory device, comprising:
   a data alignment reference pulse generation unit configured to generate a data alignment reference pulse in response to a data strobe signal;
   a data alignment suspension signal generation unit configured to generate a data alignment suspension signal in response to the data alignment reference pulse, a data strobe termination signal, and a write pulse; and
   a data alignment unit configured to align input data in response to the data alignment reference pulse and stop aligning the input data in response to the data alignment suspension signal.

2. The synchronous semiconductor memory device of claim 1, further comprising:
   a global data line write driving unit configured to receive the input data aligned in the data alignment unit and transfer the aligned data to global data lines in response to a data input clock.

3. The synchronous semiconductor memory device of claim 1, wherein the data alignment unit comprises:
   a data alignment reference pulse cut-off block configured to selectively transfer the data alignment reference pulse in response to the data alignment suspension signal; and
   a data transfer block configured to align the input data in response to an output signal of the data alignment reference pulse cut-off block.

4. A synchronous semiconductor memory device, comprising:
   a data strobe signal input buffering unit configured to buffer a data strobe signal;
   a data strobe falling pulse generation unit configured to generate a data strobe falling pulse corresponding to a falling edge of the data strobe signal in response to an output signal of the data strobe signal input buffering unit;
   a data strobe falling pulse masking signal generation unit configured to generate a data strobe falling pulse masking signal in response to the data strobe falling pulse, a data strobe termination signal, and a write pulse; and a data alignment unit configured to align input data in response to the data strobe falling pulse and stop aligning the input data in response to the data strobe falling pulse masking signal.

5. The synchronous semiconductor memory device of claim 4, wherein the data strobe signal input buffering unit buffers the data strobe signal in response to the data strobe falling pulse masking signal.

6. The synchronous semiconductor memory device of claim 4, wherein the data strobe falling pulse masking signal generation unit comprises:
   an AND gate configured to receive the data strobe falling pulse and the data strobe termination signal;
   a pull-up PMOS transistor configured to receive the write pulse, and include a source coupled with a power source voltage terminal and a drain coupled with an output terminal of the data strobe falling pulse masking signal generation unit;
   a pull-down NMOS transistor configured to receive an output signal of the AND gate, and include a source coupled with a ground voltage terminal and a drain coupled with the output terminal of the data strobe falling pulse masking signal generation unit; and
   a latch coupled with the output terminal of the data strobe falling pulse masking signal generation unit and configured to latch the data strobe falling pulse masking signal.

7. The synchronous semiconductor memory device of claim 4, wherein the data alignment unit comprises:
   a data strobe falling pulse cut-off block configured to selectively transfer the data strobe falling pulse in response to the data strobe falling pulse masking signal; and
   a data transfer block configured to align the input data in response to an output signal of the data strobe falling pulse cut-off block.

8. The synchronous semiconductor memory device of claim 7, wherein the data strobe falling pulse cut-off block comprises an NAND gate receiving the data strobe falling pulse and the data strobe falling pulse masking signal.

9. The synchronous semiconductor memory device of claim 7, wherein the data transfer block comprises a plurality of D-flip-flops.

10. The synchronous semiconductor memory device of claim 4, further including a global data line write driving unit configured to receive aligned data from the data alignment unit, synchronize the received data with a data input clock, and output the synchronized data to a global data line.

11. A method of operating a synchronous semiconductor memory device, comprising:
   generating a data alignment reference pulse in response to a data strobe signal;
   generating a data alignment suspension signal in response to the data alignment reference pulse, a data strobe termination signal, and a write pulse;
   aligning input data in response to the data alignment reference pulse; and
   controlling a cut-off of aligning the input data in response to the data alignment suspension signal.

12. The method of claim 11, wherein the controlling of the cut-off comprising:
   buffering the data strobe signal for generating the data alignment reference pulse in response to the data alignment suspension signal; and
   selectively transferring the data alignment reference pulse for aligning the input data in response to the data alignment suspension signal.

* * * * *